United States Patent [19]

Hynecek

[11] Patent Number: 5,337,340
[45] Date of Patent: Aug. 9, 1994

[54] CHARGE MULTIPLYING DETECTOR (CMD) SUITABLE FOR SMALL PIXEL CCD IMAGE SENSORS

[75] Inventor: Jaroslav Hynecek, Richardson, Tex.

[73] Assignee: Texas Instruments Incorporated, Dallas, Tex.

[21] Appl. No.: 19,995

[22] Filed: Feb. 17, 1993

Related U.S. Application Data

[63] Continuation of Ser. No. 728,427, Jul. 11, 1991, abandoned.

[51] Int. Cl.⁵ .................. G11C 19/28; H01L 29/796
[52] U.S. Cl. .................. 377/60; 257/217; 257/223; 257/229; 257/246
[58] Field of Search .................. 357/24; 377/57–63; 257/216–224, 245–248, 228, 229, 230–234

[56] References Cited

U.S. PATENT DOCUMENTS

| | | | |
|---|---|---|---|
| 3,654,499 | 4/1972 | Smith | 357/24 |
| 3,761,744 | 9/1973 | Smith | 357/24 |
| 3,792,465 | 2/1974 | Collins et al. | |
| 3,906,543 | 9/1975 | Smith et al. | 357/24 |
| 3,934,161 | 1/1976 | Caywood | |
| 3,973,136 | 8/1976 | Lee | 357/24 |
| 4,656,503 | 4/1987 | Hynecek | 357/24 |
| 4,679,212 | 7/1987 | Hynecek | 357/24 |
| 4,912,536 | 3/1990 | Lou | 357/24 |

OTHER PUBLICATIONS

"A New Noise Suppression Method for High-Definition CCD Camera", *IEEE Trans. on Consumer Electronics*, vol. 35, No. 3, pp. 368–374, Aug. 1989.

"A 250k-Pixel SIT Image Sensor Operating in its High-Sensitivity Mode", *IEEE Trans. on Electron Devices*, vol. ED-38, pp. 1021–1027, May 1991.

"New Low-Noise Output Amplifier for High-Definition CCD Image Sensor", *IEEE Trans. on Electron Devices*, vol. ED-38, pp. 1048–1051, May 1991.

Primary Examiner—Gene M. Munson
Attorney, Agent, or Firm—Alan K. Stewart; Richard L. Donaldson; William E. Hiller

[57] ABSTRACT

Generally, and in one form of the invention, a method for multiplying charge in a CCD cell is disclosed comprising the step of causing impact ionization of charge carriers in the CCD cell.

Other devices, systems and methods are also disclosed.

27 Claims, 13 Drawing Sheets

CHARGE MULTIPLYING DETECTOR (CMD) SUITABLE FOR SMALL PIXEL CCD IMAGE SENSORS

This application is a continuation of application Ser. No. 07/728,427, filed Jul. 11, 1991, now abandoned.

NOTICE (C) Copyright, *M* Texas Instruments Incorporated 1991. A portion of the disclosure of this patent document contains material which is subject to copyright and mask work protection. The copyright and mask work owner has no objection to the facsimile reproduction by anyone of the patent document or the patent disclosure, as it appears in the Patent and Trademark Office patent file or records, but otherwise reserves all copyright and mask work rights whatsoever.

FIELD OF THE INVENTION

This invention generally relates to charge multiplication devices.

BACKGROUND OF THE INVENTION

Without limiting the scope of the invention, its background is described in connection with a small pixel CCD image sensor, as an example.

Heretofore, in this field, increasing demand from the consumer market to supply higher and higher resolution CCD cameras has required designers to increase the number of pixels in the CCD image sensors that are used in these products. At the same time the competitive pressures to maintain or reduce the cost of these sensors necessitate the reduction of chip size and consequently the reduction of the active pixel area. This inevitable trend is clearly observed in the recent technical literature and also in the many product catalogs. This, however, leads to the two major problems: reduction in the image sensor sensitivity and reduction in the signal-to-noise ratio.

The sensitivity of the image sensors is proportional to the pixel area, the aperture efficiency, the quantum efficiency, the integration time, and the charge to voltage conversion factor. The maximum sensor sensitivity of present day image sensors is usually determined by the noise floor of the charge detection amplifiers which convert the collected charge into an output voltage. Without this limit it would be possible to detect the individual photons and thus achieve a photon counting operation, the ultimate performance of an image sensor which is determined by the fundamental laws of physics.

To reduce the noise floor of the charge detection amplifiers, however, is not an easy task. To achieve better performance, the sensor designers are developing various schemes of charge-to-voltage conversion using complicated kTC noise suppression circuits ("A New Noise Suppression Method for High-Definition CCD Camera", *IEEE Trans. on Consumer Electronics*, vol. 35, No. 3, pp. 368–374, August 1989), current modulation techniques ("A 250k-Pixel SIT Image Sensor Operating in its High-Sensitivity Mode", *IEEE Trans. on Electron Devices*, vol. ED-38, pp.1021–1027, May 1991), or employing many other novel charge detection structures ("New Low-Noise Output Amplifier for High-Definition CCD Image Sensor", *IEEE Trans. on Electron Devices*, vol. ED-38, pp. 1048–1051, May 1991). There is, however, a well known technique, which has been used for many years in image orthicon camera vacuum tubes. It is a carrier multiplication process.

There are many solid state devices available on the market today that utilize some form of carrier multiplication. These devices are typically referred to as "Avalanche Photo Diodes" (APD) and are used in optical communications. A large amount of literature has been accumulated on this subject and a good review can be found elsewhere ("Lightwave Communication Technology", *Semiconductors and Semimetals*, vol. 22, New York:Academic Press, 1985). Recently, an article describing the carder multiplication in a sensing pixel that can be used in an area image sensor has also appeared ("A novel High-Gain Image Sensor Cell Based on Si p-n APD in Charge Storage Mode Operation", *IEEE Trans. on Electron Devices*, vol. ED-37, pp. 1861–1868, August 1990).

The carrier multiplication as is used in the solid state APD sensors and in common vacuum tube photomultipliers is effective in increasing the sensitivity and the signal to noise ratio, since the noise associated with this process is very low. This allows the sensor to increase the number of carriers well above the amplifier noise floor and thus provide the photon counting mode of operation. The signal-to-noise ratio of the output signal is then almost equal to the signal-to-noise ratio of the input photon flux rather than being limited by the noise of the charge detection amplifiers. However, devices based on the APD concept are too large to incorporate into a pixel of an image array and the gains may be limited.

Some of the problems faced by designers have been the inability to incorporate the charge multiplication function into a solid state image sensor array in a way that would allow for higher carrier multiplication factors comparable to vacuum tube photodetectors (which do not record an image), and also devising a method to achieve higher multiplication factors than are possible with devices employing carrier multiplication in the photosite. Accordingly, improvements which overcome any or all of the problems are presently desirable.

SUMMARY OF THE INVENTION

It is herein recognized that a need exists for a CCD image sensor with a charge multiplication ability. The present invention is directed towards meeting those needs.

Generally, and in one form of the invention, a method for multiplying charge in a CCD cell is disclosed comprising the step of causing impact ionization of charge carriers in the CCD cell.

In another form of the invention, a method for multiplying charge in a CCD cell is disclosed comprising the steps of temporarily holding charge in a potential well in the CCD cell, creating an electric field region in a portion of the CCD cell separated from the potential well, the electric field being of sufficient strength to cause impact ionization by carriers traversing the field, and causing the charge in the potential well to flow into the electric field region, the flow resulting in multiplication of the charge by impact ionization.

In another form of the invention, a method for automatic gain control in an image sensor array is disclosed comprising the steps of sensing an image in the array, detecting a level of charge generated by the image in the array, and adjusting a bias level applied to the array in response to the detected level, the bias level generating a proportional electric field in at least one cell of the array in order to cause impact ionization by charge carriers moving in the field.

In yet another form of the invention, a charge multiplying device (CMD) CCD cell is disclosed wherein charge is multiplied by impact ionization of charge carriers in the CCD cell.

In another form of the invention, a charge multiplying device (CMD) CCD cell is disclosed comprising a potential well for temporarily holding charge, an electric field region in a portion of the CCD cell separated from the potential well, the electric field being of sufficient strength to cause impact ionization by carriers traversing the field, and means for causing the charge in the potential well to flow into the electric field region, the flow resulting in multiplication of the charge by impact ionization.

In still another form of the invention, an image sensor array having automatic gain control is disclosed comprising an array for sensing an image, a detector coupled to an output of the array for detecting a level of charge generated by the image in the array, and circuitry coupled to the array and the detector for adjusting a bias level applied to the array in response to the detected level, the bias level generating a proportional electric field in at least one cell of the array in order to cause impact ionization by charge carriers moving in the field.

In another form of the invention, a motion video camera is disclosed comprising an image sensor array having automatic gain control comprising an array for sensing an image, a detector coupled to an output of the array for detecting a level of charge generated by the image in the array, and circuitry coupled to the array and the detector for adjusting a bias level applied to the array in response to the detected level, the bias level generating a proportional electric field in at least one cell of the array in order to cause impact ionization by charge carriers moving in the field.

In still another form of the invention, a still video camera is disclosed comprising an image sensor array having automatic gain control comprising an array for sensing an image, a detector coupled to an output of the array for detecting a level of charge generated by the image in the array, and circuitry coupled to the array and the detector for adjusting a bias level applied to the array in response to the detected level, the bias level generating a proportional electric field in at least one cell of the array in order to cause impact ionization by charge carriers moving in the field.

An advantage of the invention is that it makes possible image sensors with higher sensitivity, improved signal-to-noise ratio, and variable gain.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

The present invention provides for an image sensor in which the carrier multiplication is produced in a typical CCD image sensor during the charge transferring process, rather than in a sensing pixel. This novel approach thus opens up the possibility of building solid state image sensors whose performance is equal to or exceeds the action of the image orthicon.

The incorporation of the charge multiplication into the CCD device enhances one of its key advantages. The advantage of the CCD over the MOS or CID sensors is that the charge collected in a photosite can be efficiently transferred to a remotely located (usually on-chip) charge sensing amplifier. The amplifier can then be optimized for maximum performance since it has virtually no layout restrictions. The transfer to the charge detection amplifier is accomplished at a high speed from many pixel locations and at virtually no loss.

By utilizing the concept of the present invention, it is now also possible to add a low noise charge multiplying structure into the charge transferring path. This will increase the number of carriers reaching the charge sensing detector, which will make it much easier to detect low level signals, particularly at higher frequencies. The CCD image sensors utilizing this concept will, therefore, have an advantage in higher sensitivity, lower noise, and a variable gain that can be externally controlled by changing the field strength in the charge multiplication regions.

Figure 1:
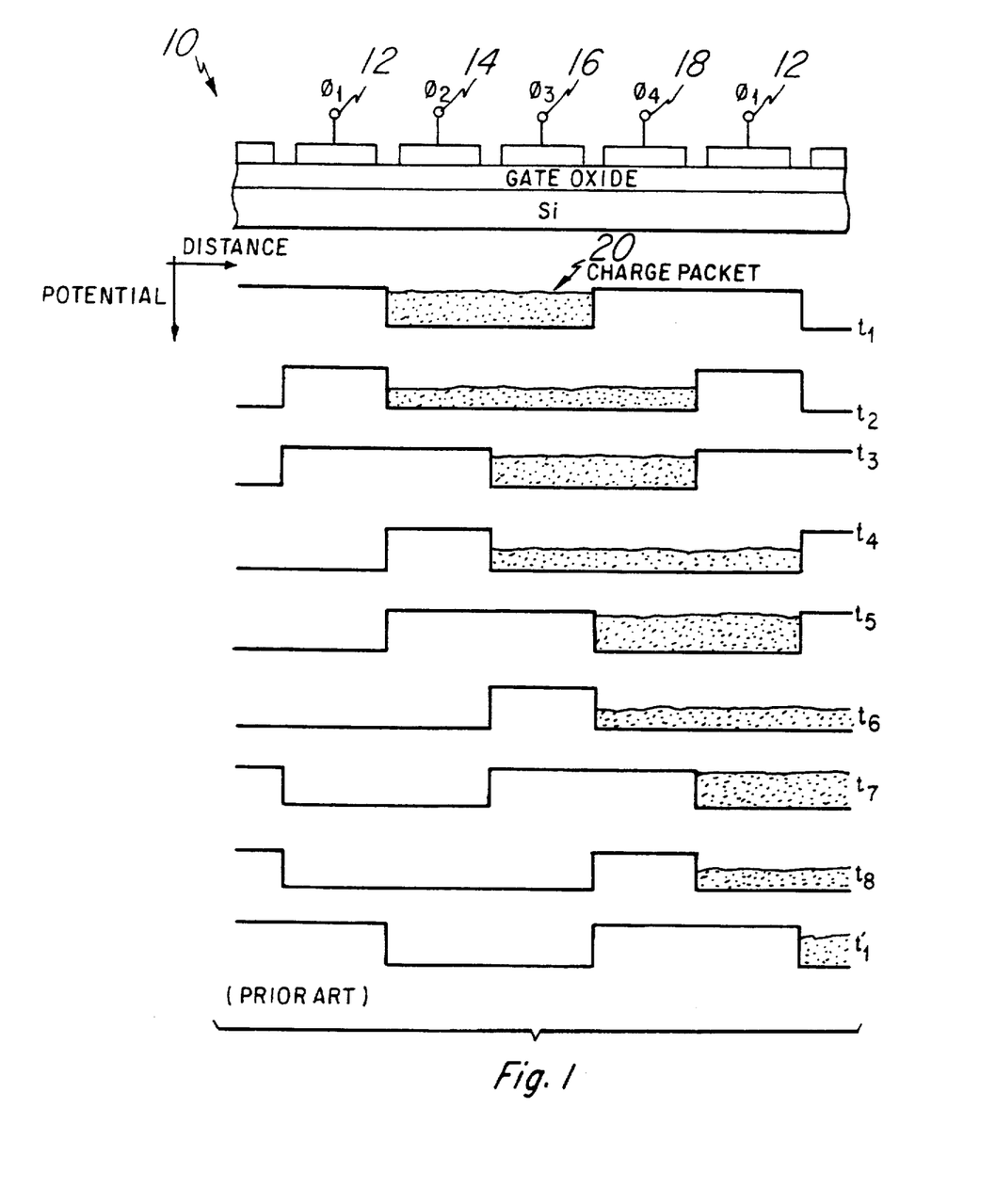
FIG. 1 is a cross-sectional view of a prior art four phase CCD cell.
Figure 2:
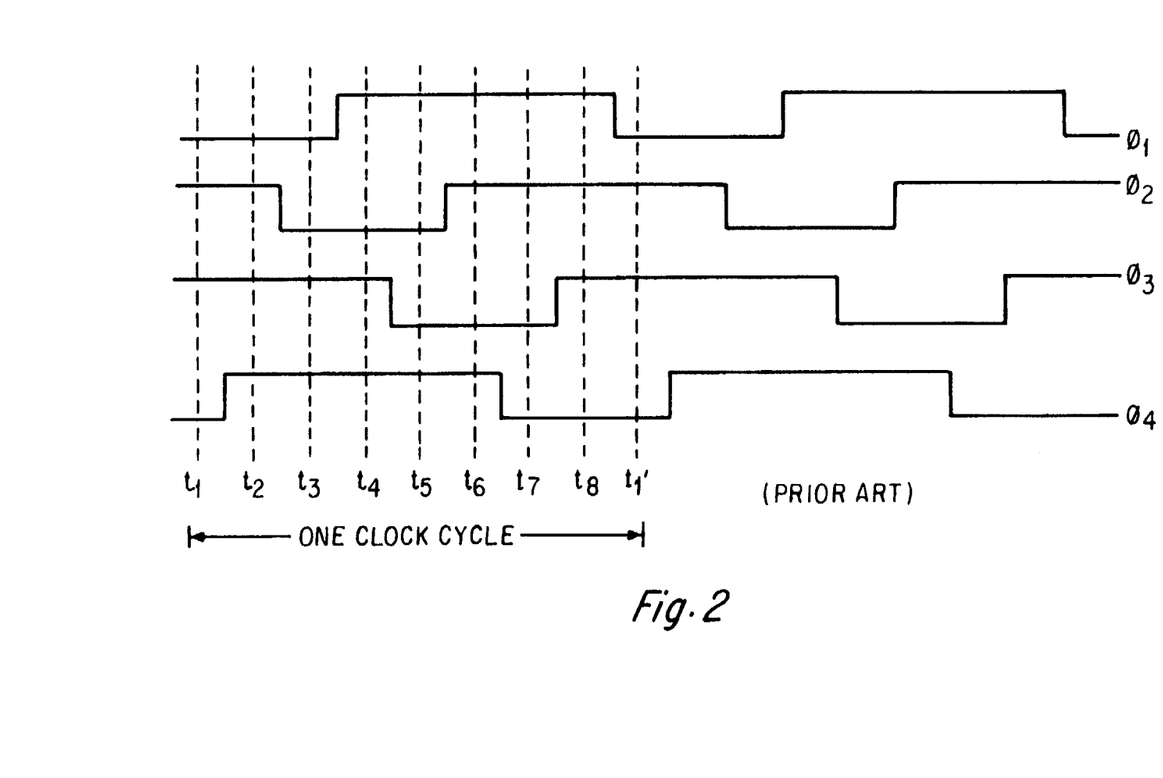
FIG. 2 is a timing diagram for the four phase CCD cell of FIG. 1.

FIG. 1 illustrates a simple 4 phase CCD structure, indicated generally at 10, which is constructed by methods well known in the art. FIG. 2 is a timing diagram showing the pulses applied to the respective four gate electrodes 12, 14, 16 and 18 of FIG. 1 in order to achieve standard four phase charge transfer (without charge multiplication) through the device. The potential diagrams in FIG. 1 illustrate the potential profile in the CCD channel at various times shown on the timing diagram of FIG. 2. It will be readily apparent to those skilled in the art that charge is transferred along the channel by sequentially creating a potential well at the leading edge of the direction of charge travel and then removing a potential well at the trailing edge. The charge packet 20 thus travels along the CCD channel from left to right. The time period from $t_1$ to $t_1'$ represents one clock cycle, as the charge packet 20 has been moved through four phase regions.

Figure 3:
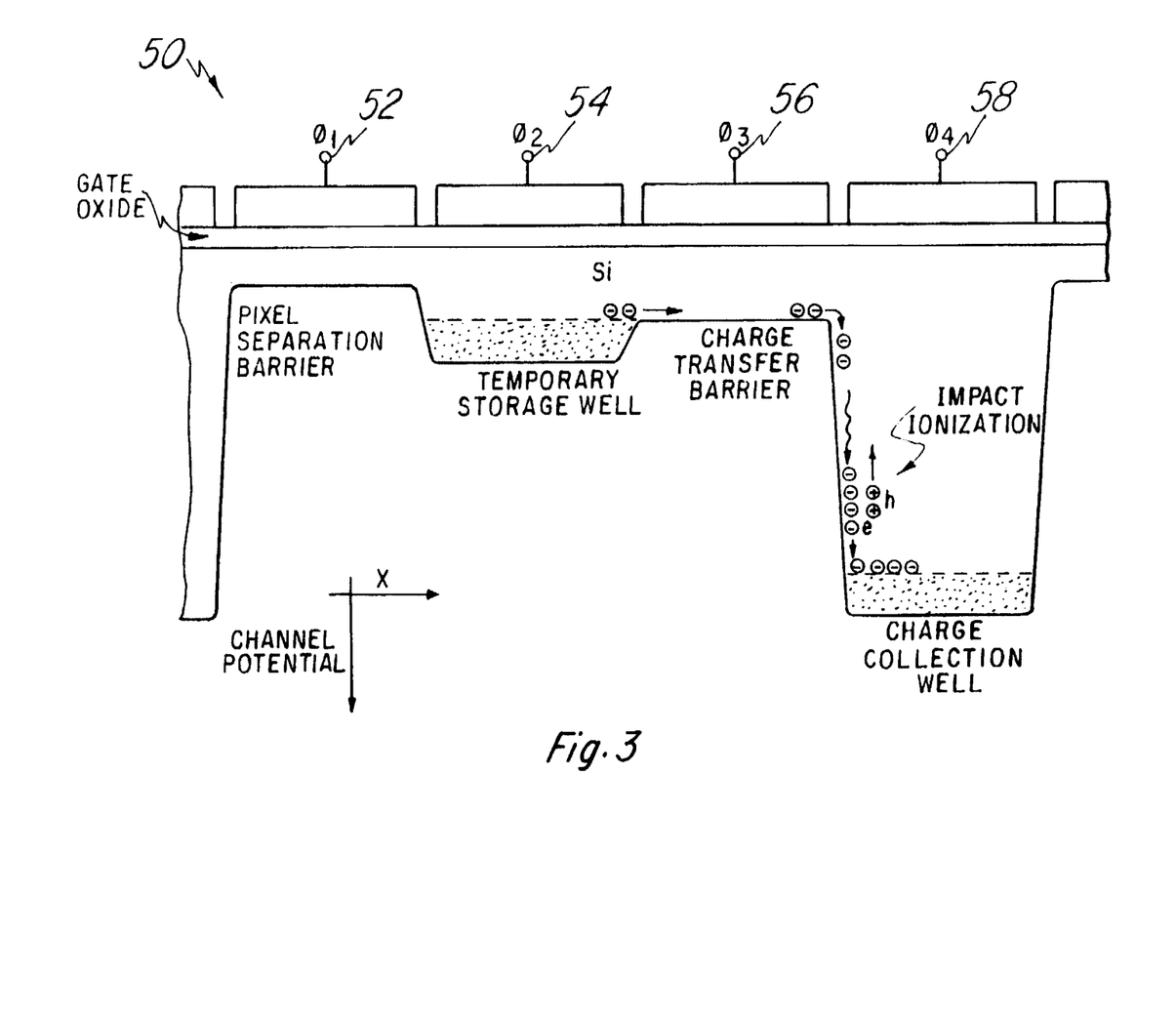
FIG. 3 is a is a cross-sectional view of a first preferred embodiment of the present invention.
Figure 4:
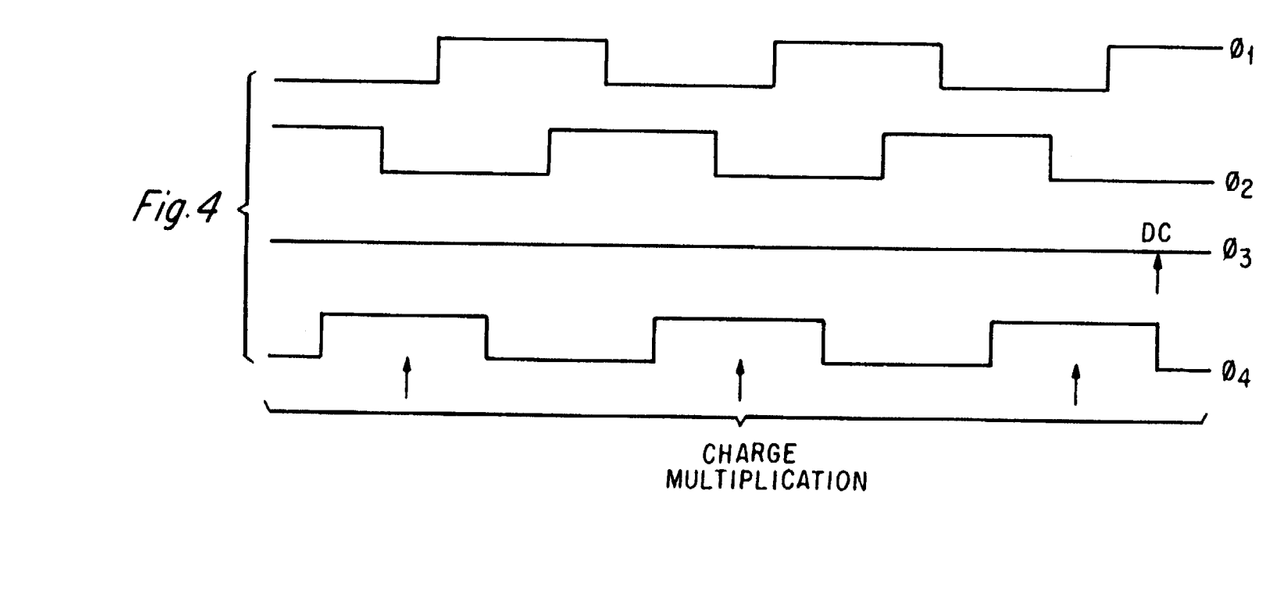
FIG. 4 is a timing diagram for charge multiplication operation of the first preferred embodiment of the present invention.

Illustrated in FIG. 3 is a first preferred embodiment of the present invention, illustrated generally at 50, which incorporates the charge multiplication function into the prior art CCD cell of FIG. 1. FIG. 4 illustrates a timing diagram showing the pulses applied to the respective four gate electrodes 52, 54, 56 and 58 in order to achieve charge transfer and multiplication through the device. The DC biased transfer barrier is formed under the phase 3 electrode 56 with the temporary storage well under the phase 2 electrode 54. The phase 1 serves as a pixel separator and the high field region is formed at the interface between the phase 3 electrode 56 and phase 4 electrode 58. As the bias of the phase 2 electrode 54 lowers (i.e. as the potential well raises), stored charge is injected over the transfer barrier under the phase 3 electrode 56 and into the high field region between the phase 3 electrode 56 and the phase 4 electrode 58 (the formation of the high field region is described hereinbelow). When a carrier travels in a CCD channel, it travels, on average, a "mean free path", before interacting with an atom in the lattice and losing its energy. However, if the electric field in the channel is large enough, the career can gain sufficient energy from the field, while traveling within its mean free path, such that it frees additional electrons from the valence band upon impacting the lattice. The initial carrier, as well as the hole and electron created by the collision are then free to leave the region of the collision. This process is called impact ionization. During this process the electron-hole pairs are separated by the field perpendicular to the surface of the CCD and only the electrons are collected in the well under the phase 4 electrode 58. The holes flow either to the bulk or to the silicon-silicon dioxide interface depending on the type of the CCD structure and the location of their creation. The generated holes usually do not further participate in the multiplication process. The multiplication, therefore, involves only a single carrier which is known to be an inherently low noise process.

After all the careers have transferred through the high field region and multiplied, it is now possible to proceed with their transfer to the next stage. This is accomplished by biasing the phase 1 electrode 52 high and the phase 4 electrode 58 low, followed by biasing the phase 2 electrode 54 high and the phase 1 electrode 52 back low to its original level. The careers now reside in the temporary storage well of the next stage and are ready for the next multiplication. This is initiated by biasing the phase 4 electrode 58 high and injecting the charge again over the potential barrier under the phase 3 electrode 56. From the FIG. 3 it can be also observed that it is possible to transfer the carriers back to the temporary storage well under the phase 2 electrode 54. This is accomplished by lowering the bias of the phase 4 electrode 58 and increasing the bias of the phase 2 electrode 54. In this case the high field region will occur between the phase 2 electrode 54 and the phase 3 electrode 56 (because of the large potential difference between the two regions) and the multiplied carriers will be collected in the well from which they have originally started (e.g. phase 2). This alternate method of carrier multiplication by bidirectional transfer may be advantageous in cases where there is not enough space available for long structures with many stages and where the number of transfers needs to be externally varied.

To achieve the charge multiplication in a CCD channel it is necessary to transfer the carriers through the regions which have large lateral fields. These fields can be created by applying a potential difference between two adjacent gate electrodes or by supplying divergent doping profiles in two adjacent regions (by ion implantation, heteroepitaxial deposition, etc.). In a typical CCD device the large fields are present in the regions between the gate electrodes, but the carrier multiplication usually does not occur. The design of a modem CCD is optimized to achieve a smooth potential profile from one gate to another so that the fringing (lateral) fields can reach as far as possible under each gate. The reason for this design is to achieve a fast field-aided charge transfer with maximum charge transfer efficiency (CTE). As the bias to the gates is changed the charge almost immediately flows to reach the potential minimum and usually does not encounter any large fields since they have not yet developed. When the bias on the gates reaches its maximum level, all of the charge is usually already stored in the next well. Another reason for lack of carrier multiplication in a standard CCD channel is that a typical CCD is designed to operate near its full well capacity. The large amount of charge in the channel reduces the internal fields and this prevents formation of avalanche conditions.

In order to achieve the charge multiplication, it is desirable that three requirements be satisfied. The first is that charge must be temporarily kept in a storage well behind a transfer barrier while the bias on the gates change and the large fringing fields have time to develop. This transfer delay is necessary since the bias on the gates cannot change very fast, usually due to the external clock driver limitations. After the fields reach their maximum strength, charge can be injected over the transfer barrier into the high field regions. The second condition is that the field must be sufficiently high so that the accelerated carriers reach a high enough energy to cause impact ionization in the material of the CCD channel. Finally, the amount of charge transferred in the CCD channel must be small relative to the CCD channel capacity in order to avoid the field self quenching effect. In some applications, however, this self-limiting function may be used to advantage by extending the dynamic range of the device through compression of the signal.

Figure 5:
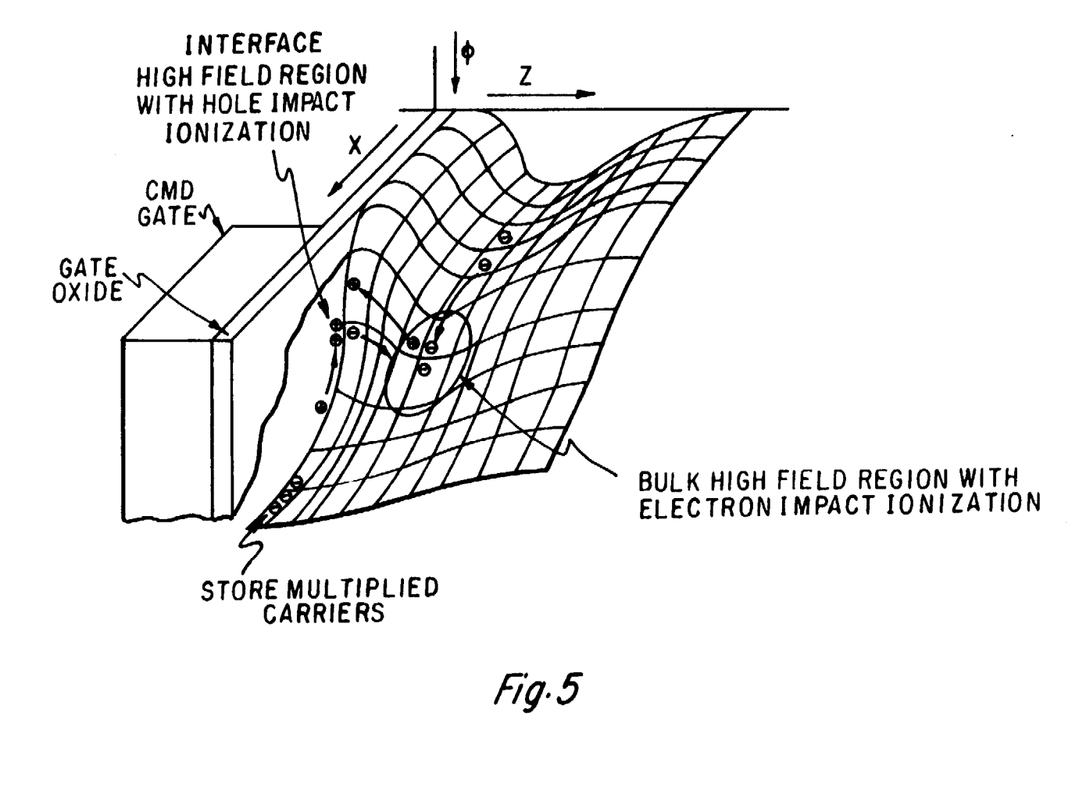
FIG. 5 is a cross-sectional two-dimensional potential profile diagram of a the area below the charge multiplication gate of the first preferred embodiment of the present invention.

There are two types of CCD devices which are frequently used today: the surface channel CCD and the buffed channel CCD. The charge multiplication concept is applicable to both of these types, even though the preferred embodiments of the present invention are directed to the buffed channel devices. The problem which will have to be overcome, however, is that the charge travels in a channel away from the surface and at some distance from the gate electrodes. Unfortunately, larger channel distance from the electrodes tends to smooth out the lateral potential profile. The highest lateral fields are present between the gate electrodes and diminish with the increasing depth into the bulk. As a consequence it will be more difficult to generate high avalanche fields in the buffed channel devices. This is illustrated in FIG. 5 in a cross-sectional two-dimensional sketch of a potential profile diagram for the area of the CCD channel below the charge multiplying gate (e.g. the phase 4 electrode 58 of FIG. 3), which shows the field potential at its highest level immediately adjacent the CMD gate.

Figure 6:
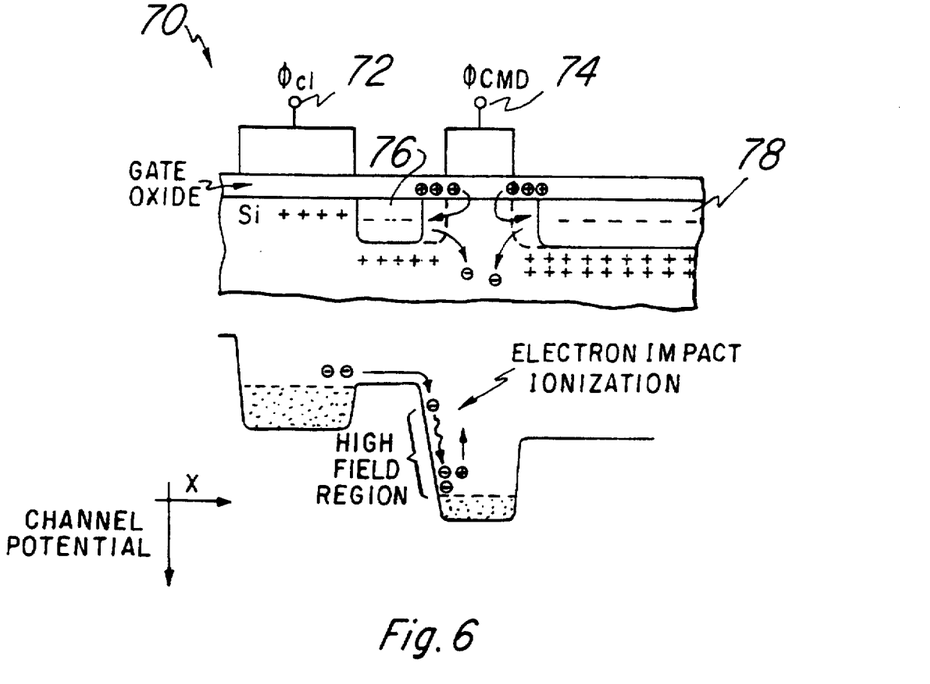
FIG. 6 is a cross-sectional view of a second preferred embodiment of the present invention.

FIG. 6 illustrates generally at 70 a prior art virtual phase buffed channel CCD device (Texas Instruments TC211) whose operation has been modified to experimentally demonstrate a second preferred embodiment of the present invention. The standard operation of the CCD itself is described in detail in U.S. Pat. No. 4,679,212, granted to the applicant of the present application, and incorporated herein by reference.

Figure 7:
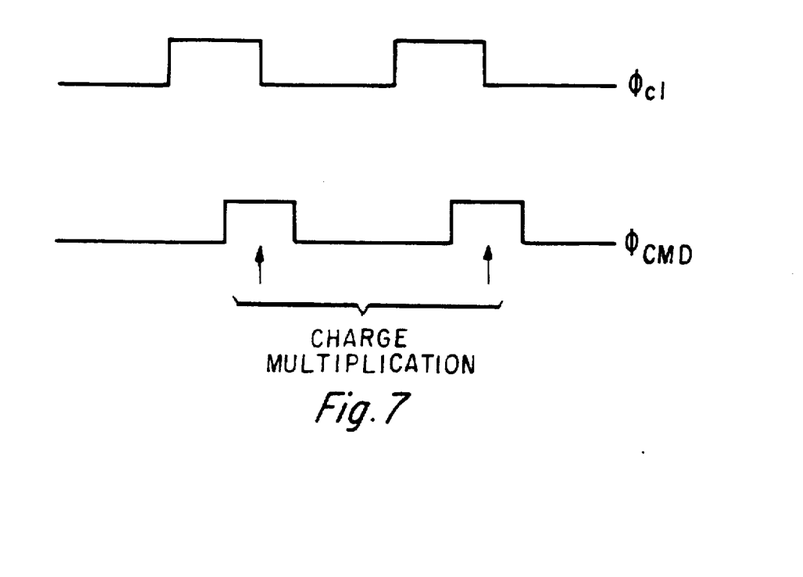
FIG. 7 is a timing diagram for charge multiplication operation of the second preferred embodiment of the present invention.

From FIG. 6 it is apparent that the standard antiblooming gate present in the TC211 can be used as a CMD gate 74 if the device is properly clocked. The high field can be built in the interface between the virtual barrier existing under the region 76 and the CMD gate 74 before the charge is injected from the clocked well under the gate electrode 72. After the charge injection is completed, the CMD gate 74 bias can be lowered and the charge transferred to the virtual well found under the region 78 to be ready for the next cycle. The timing diagram is shown in FIG. 7 and the block diagram of the experimental setup is shown generally at 80 in FIG. 8.

Figure 8:
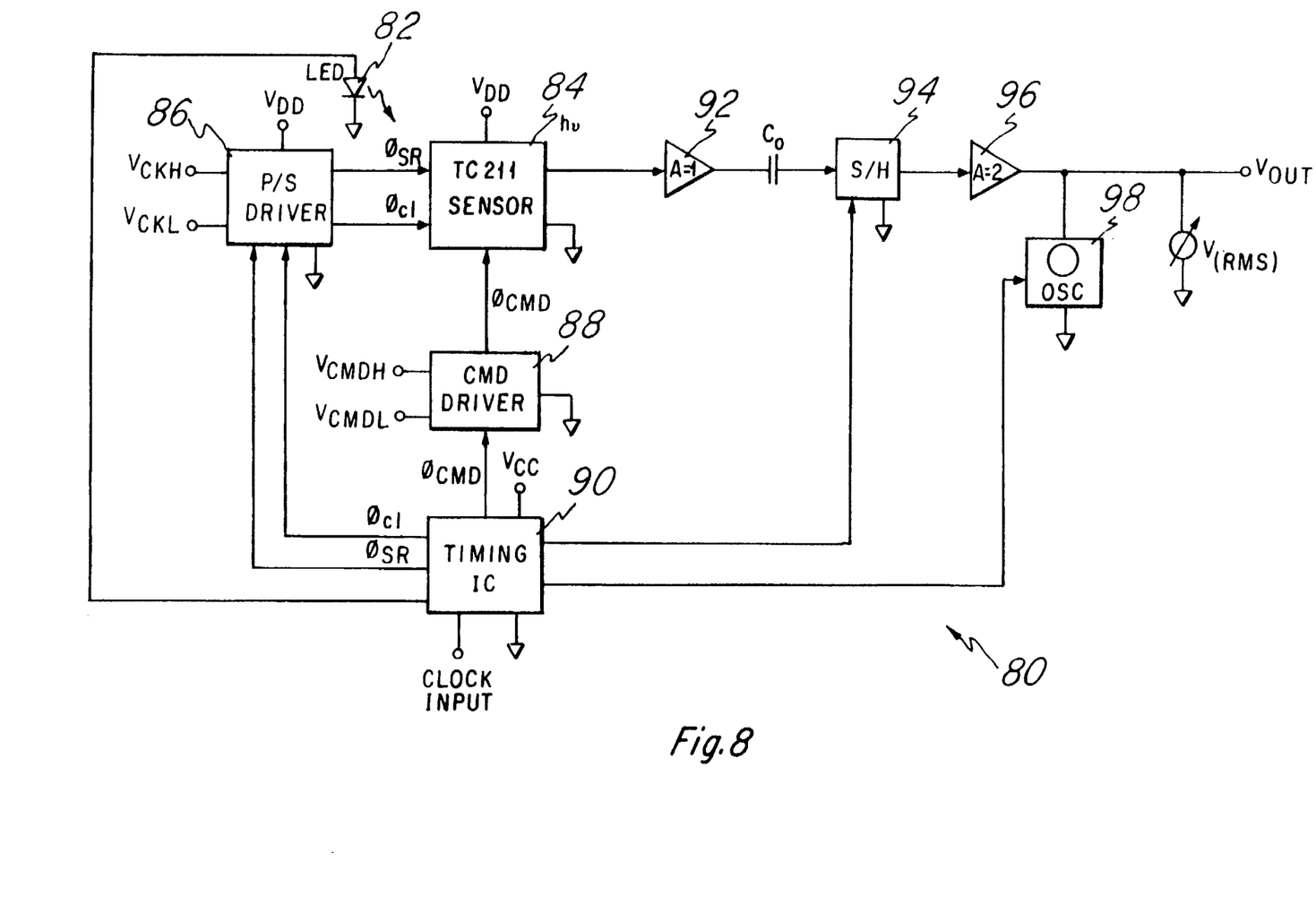
FIG. 8 is a schematic diagram of the experimental circuit used to demonstrate charge multiplication in the device of the second preferred embodiment.

In order to clearly demonstrate the effect of the charge multiplication in a CCD structure, the TC211 device 84 of FIG. 8 had a horizontal bar pattern (parallel to the horizontal shift register) projected onto the image sensing area. The LED light source 82 used for the illumination was pulsed only during the integration time, since the TC211 sensor 84 is a full frame device. The LED 82 illuminated the image sensing area with a good uniformity. The timing pulses of FIG. 7 were supplied to the sensor 84 by drivers 86 and 88 under the control of a preprogrammed timing IC 90. The serial shift register output from sensor 84, controlled by $\phi_{SR}$ from driver 86, was fed through amplifier 92, sample and hold circuit 94 and another amplifier 96. This output was then displayed on an oscilloscope 98.

Figure 9:
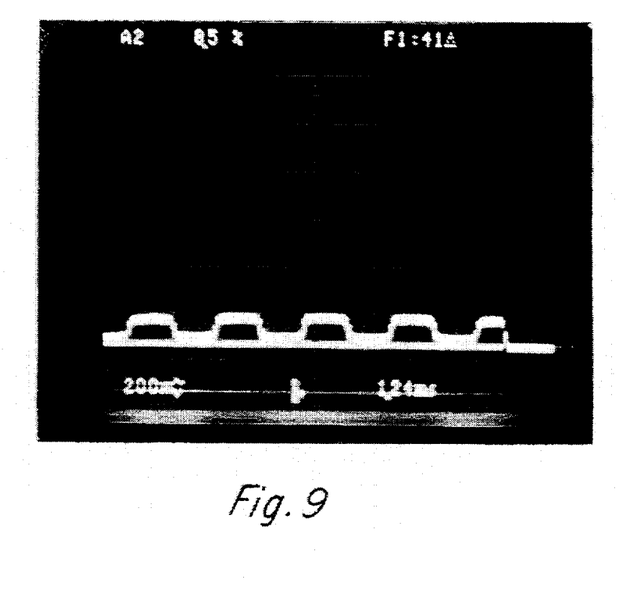
FIG. 9 is an oscilloscope trace of the video output of the circuit of FIG. 8 when exposed to a uniformly illuminated horizontal bar pattern with charge multiplication not activated.
Figure 10:
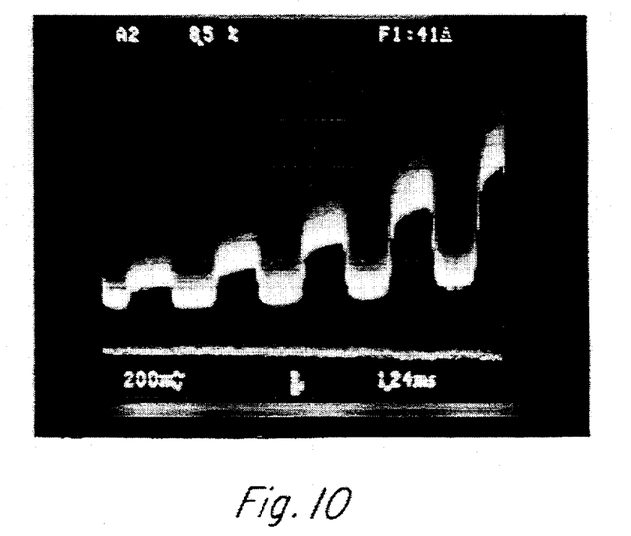
FIG. 10 is an oscilloscope trace of the video output of the circuit of FIG. 8 when exposed to a uniformly illuminated horizontal bar pattern with charge multiplication activated.

The oscilloscope picture in FIG. 9 shows the video output of this circuit when the charge multiplication function is not activated. It can be dearly seen that the output reflects the uniform illumination of the alternating light and dark regions of the horizontal bar pattern used as an image. In contrast, the oscilloscope picture in FIG. 10 shows the resulting video output of the circuit of FIG. 8 when the charge multiplication function is activated. From this picture it is apparent that charge from the stripes located near the serial shift register of the image sensor 84 (left side of the picture), which transfers only through a small number of CCD stages (and hence a small number of charge multiplication stages), does not show any significant multiplication and has a nominal level. On the other hand, charge from the top of the image area (fight side of the picture), that has to transfer through approximately 165 stages, is significantly amplified. This photograph thus confirms the expected charge multiplication behavior of the modified operation of the device of FIG. 6.

The maximum multiplication obtained from the circuit of FIG. 8 was roughly 5×. Taking into account that the device contained 165 lines, this translates into a gain per transfer of approximately $M_o = 1.01$, or a moderate 1% multiplication of the signal level per stage. Realizing that this performance level was achieved with a quick biasing modification to an existing commercial CCD image sensor, it is expected that even higher multiplication factors may be achieved when device design is optimized to the charge multiplication function.

Even though charge multiplication has been demonstrated in a CCD channel as shown above, there is still a concern with demonstrating that this is a solution to the low sensitivity and high noise problems inherent in prior art small pixel CCD image sensors. The key parameter that must be investigated, in addition to the multiplication factor M, is the noise generated during the charge multiplication process itself. This noise is usually characterized by an excess noise factor F, which is defined as follows:

$$F = (1/M^2) <n^2> / <n_o^2>. \qquad (1)$$

The pointed brackets in equation (1) indicate ensemble averaging, $<n^2>$ and $<n_o^2>$ are the signal carrier variances before and after the multiplication, and M is the multiplication factor defined as:

$$M = <n>/<n_o>. \qquad (2)$$

The multiplication gain factor M was measured first on the device of FIG. 8 with the results shown in FIG. 10. The graph shows the dependency of the gain upon the CMD gate high level bias and has a shape as would be expected. A substantial gain increase is observed for the gate biases in the vicinity of 20 volts. The threshold at which a first noticeable gain, larger than unity, is observed is approximately 14 volts. Gate biases larger than 22 volts resulted in the increase of column-to-column nonuniformities and a near saturation of the output. It is assumed that at this point the avalanche fields were beginning to be quenched by the large amount of charge traveling through the CCD channel, which may have somewhat reduced the multiplication.

Figure 11:
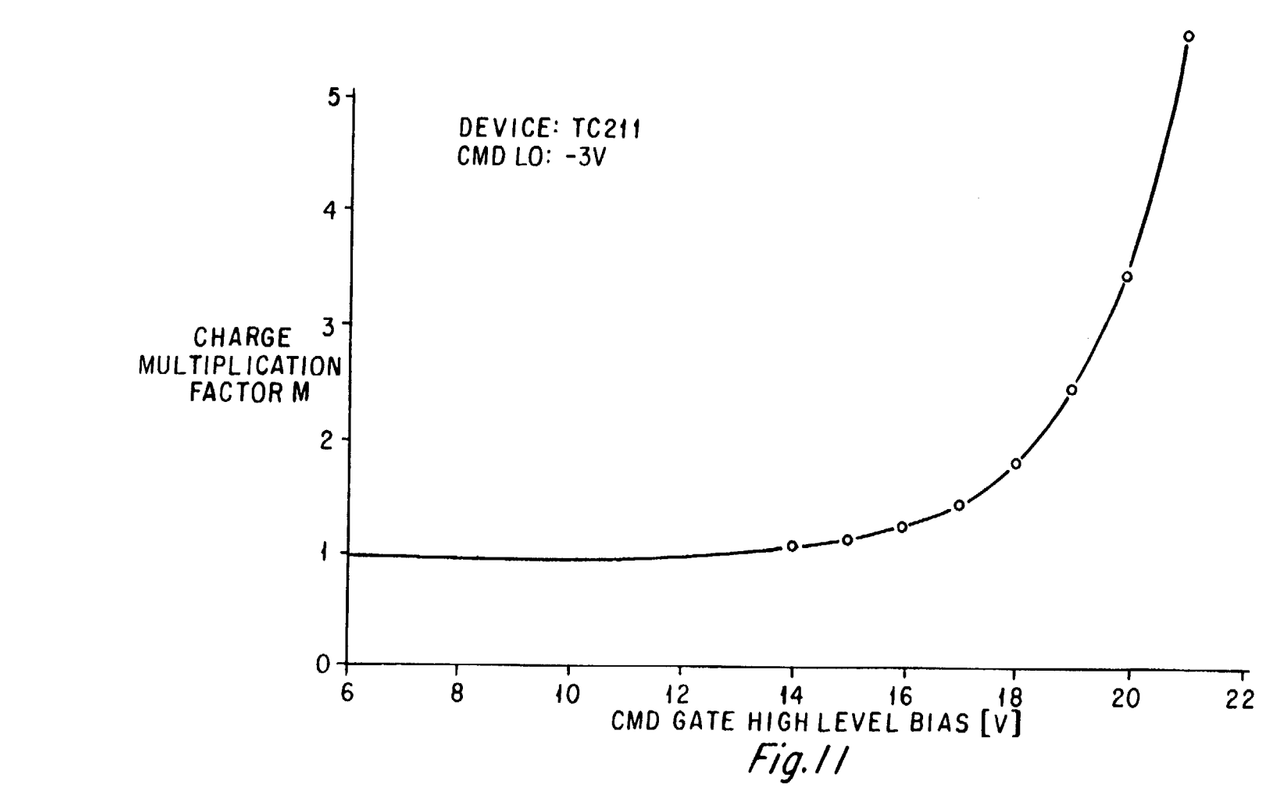
FIG. 11 is a plot of charge multiplication factor, M, versus CMD gate bias for the circuit of FIG. 8.
Figure 12:
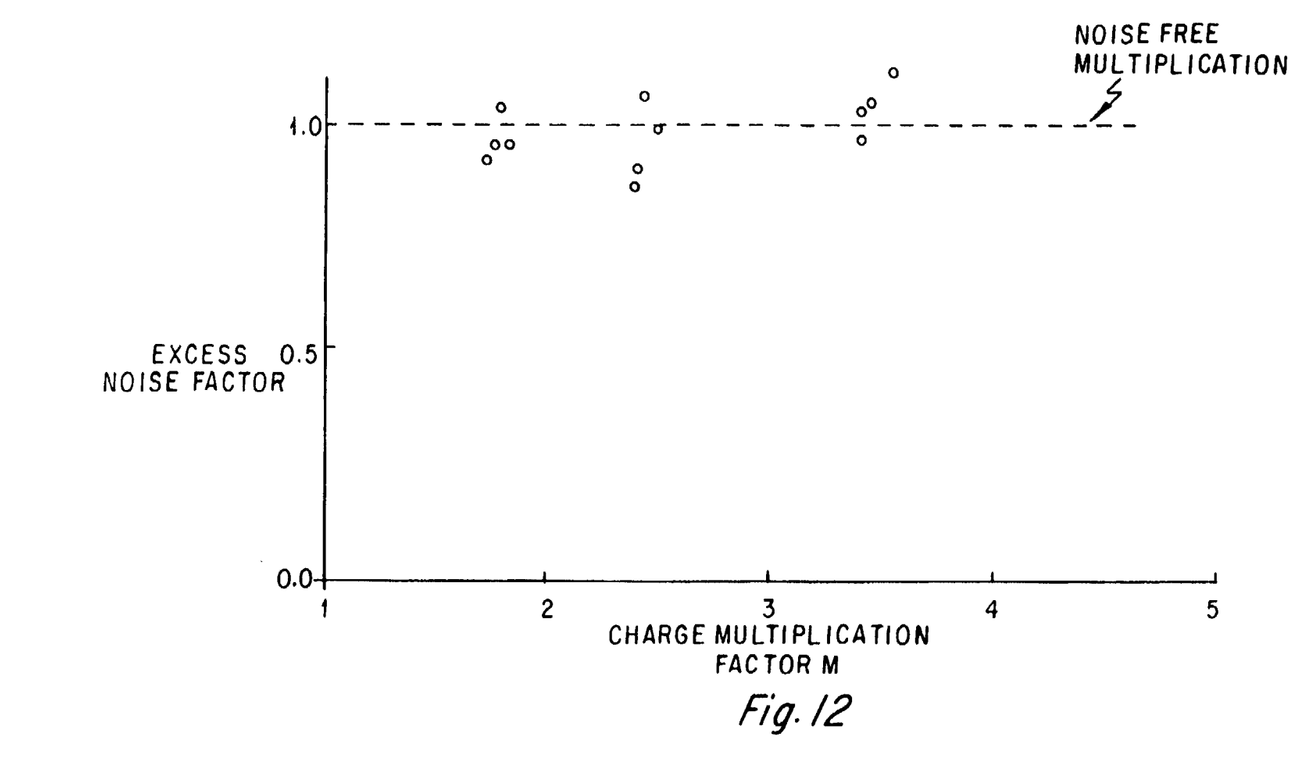
FIG. 12 is a plot of excess noise factor, F, versus charge multiplication factor, M, for the circuit of FIG. 8.

The result of the excess noise factor F measurement is shown in FIG. 11. From this figure it is clear that the excess noise factor is approximately equal to $F = 1$. It is also largely independent of the multiplication factor M. This is a very encouraging result which suggests that near photon counting performance is available from standard CCD image sensors. This can be shown as follows:

$$(S/N)_p = (n_p)^{\frac{1}{2}}, \qquad (3)$$

$$(S/N)_{st} = n_p(n_p + n_a^2)^{-\frac{1}{2}}, \qquad (4)$$

$$(S/N)_{cmd} = n_p(n_pF + (n_a/M)^2)^{-\frac{1}{2}}, \qquad (5)$$

where $n_p$ is the number of photon generated carriers, $(S/N)_p$ is the signal-m-noise ratio of the photon generated carriers, $(S/N)_{st}$ is the signal-to-noise ratio of a standard CCD image sensor, $(S/N)_{cmd}$ is the signal-to-noise ratio of a CCD image sensor with charge multiplication, and $n_a$ is the amplifier noise floor in number of equivalent electrons. By normalizing the signal-to-noise ratio of the CCD with the CMD device to the signal-to-noise ration on the input signal $(S/N)_p$, it is possible to define the following figure of merit $Q_m$:

$$(Q_m)_{cmd} = (F + (n_a/M)^2/n_p)^{-\frac{1}{2}}. \qquad (6)$$

From this equation, it is easily seen that even for moderate gains of, for example, $M = 20$, using a conventional charge detection amplifier with a CDS (correlated double sampling, defined in U.S. Pat. No. 4,656,503 issued to the applicant of the present application and incorporated herein by reference) circuit that can easily achieve a noise floor of $n_a=20$ electrons, it is possible to reach $(Q_m)_{cmd}=0.707$ at $n_p=1$ electron. On the other hand, if the CMD is not used, $(Qm)_{st}$ will be:

$$(Q_m)_{st}=(1+n_a^2/n_p)^{-\frac{1}{2}}. \qquad (7)$$

For this case, $(Q_m)_{st}=0.707$ will be reached only at $n_p=400$ electrons. This is markedly lower performance that will cause the standard CCD image sensors to lose their competitiveness against sensors with CMD.

A few of the advantages of the CMD concept are: the CMD can be easily implemented in any existing CCD structure ranging from the multiphase devices to the single phase virtual gate CCDs. Many stages can be cascaded to achieve high gains. The gain is externally controllable by adjusting the CMD gate clock amplitude. Finally, the high fields can be pulsed on only when needed during the charge injection and multiplication. The high fields can be turned off when there is no need for charge to be multiplied in order to minimize the possible unwanted dark career generation.

Figure 13A:
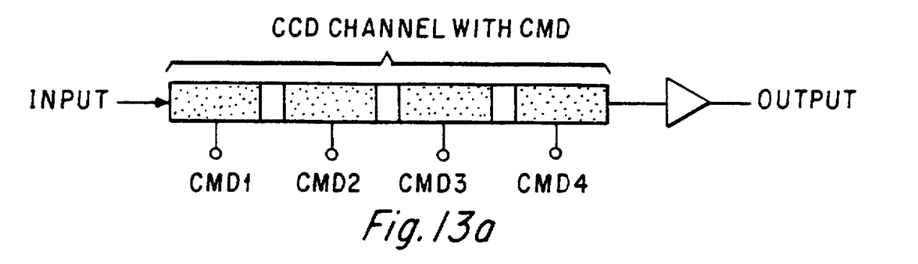
FIG. 13a–d are schematic diagrams of sample device layouts incorporating the CMD function.
Figure 13B:
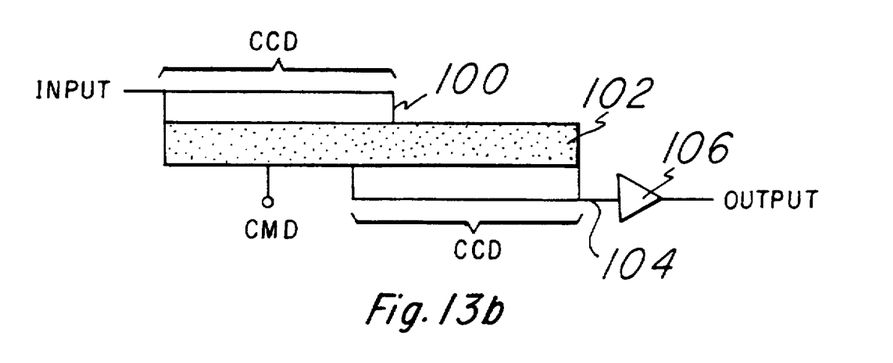
Figure 13C:
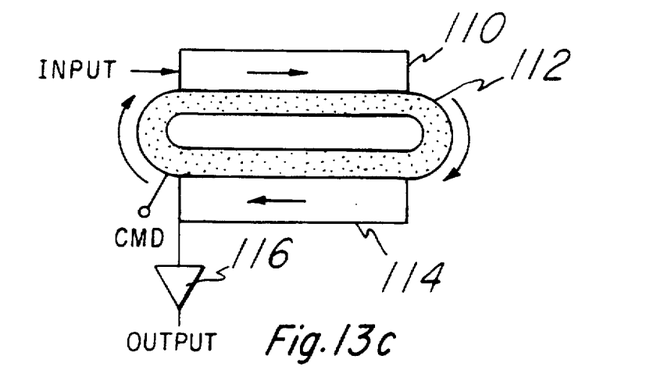
Figure 13D:
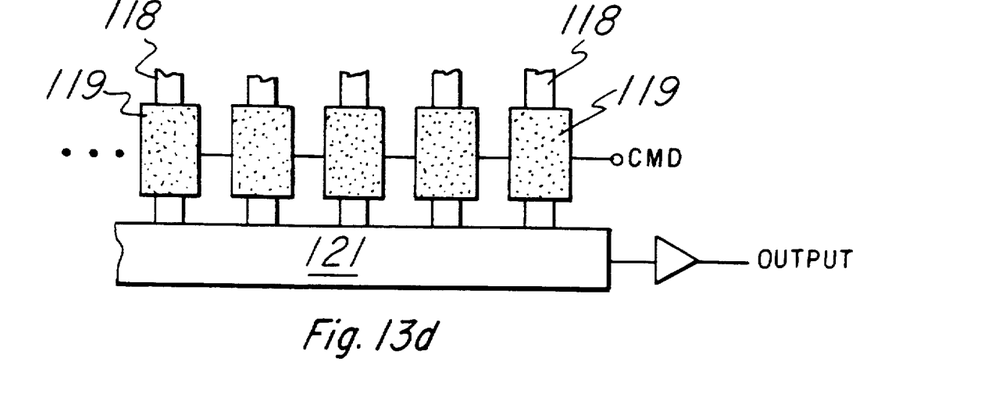

Another advantage is the extreme flexibility in device layout that is possible while still maintaining the basic advantage of the novel charge multiplication concept. A few examples are shown in FIG. 13. FIG. 13(a) shows a straightforward approach with the CMD function incorporated into each stage, or a group of stages, of a CCD channel. The charge multiplication factor, M, may be independently controlled for each stage or group of stages, or all control lines may be tied to a single driver. FIG. 13(b) illustrates a novel structure which allows for the repeated multiplication of charge in applications where space is severely limited. The signal is serially input into a conventional CCD channel 100. It is then shifted in parallel into the CMD channel 102 where it is serially shifted to the fight and multiplied with each shift, after which it is shifted in parallel to the output CCD channel 104 and on to amplifier 106. This particular embodiment has the advantage that once in the CMD channel 102, the signal may be repeatedly shifted from left to fight, fight to left, etc. until the desired charge multiplication is achieved. This level of charge multiplication may be fixed or continuously variable depending on external conditions. FIG. 13(c) shows an example of a CCD structure laid out in "racetrack fashion". The signal is serially input into a standard CCD channel 110, shifted in parallel into the CMD channel 112, where it is serially shifted around the loop as many times as necessary to achieve the desired charge multiplication, after which it is shifted in parallel to the output CCD register 114 and on to amplifier 116. This layout also allows for many multiplication stages in a very small space. Finally, FIG. 13(d) shows several parallel CCD channels 118 which contain CMD cells 199 under the control of a single control line. All of the CCD channels 118 empty into serial shift register 121, which shifts the charge to the output. This layout, as well as many similar and analogous ones, allow for the same amount of gain to be introduced into each of several parallel CCD channels, and is very useful in image sensor arrays.

The charge multiplication concept of the present invention may be readily incorporated into any CCD design presently known in the art. For example, the CCD desings which can benefit from charge multiplication include: multiphase CCDs with or without implanted well regions, CCDs based on two dimensional electron gas structures, virtual phase CCDs, buffed channel devices, surface channel devices, etc.

Figure 14:
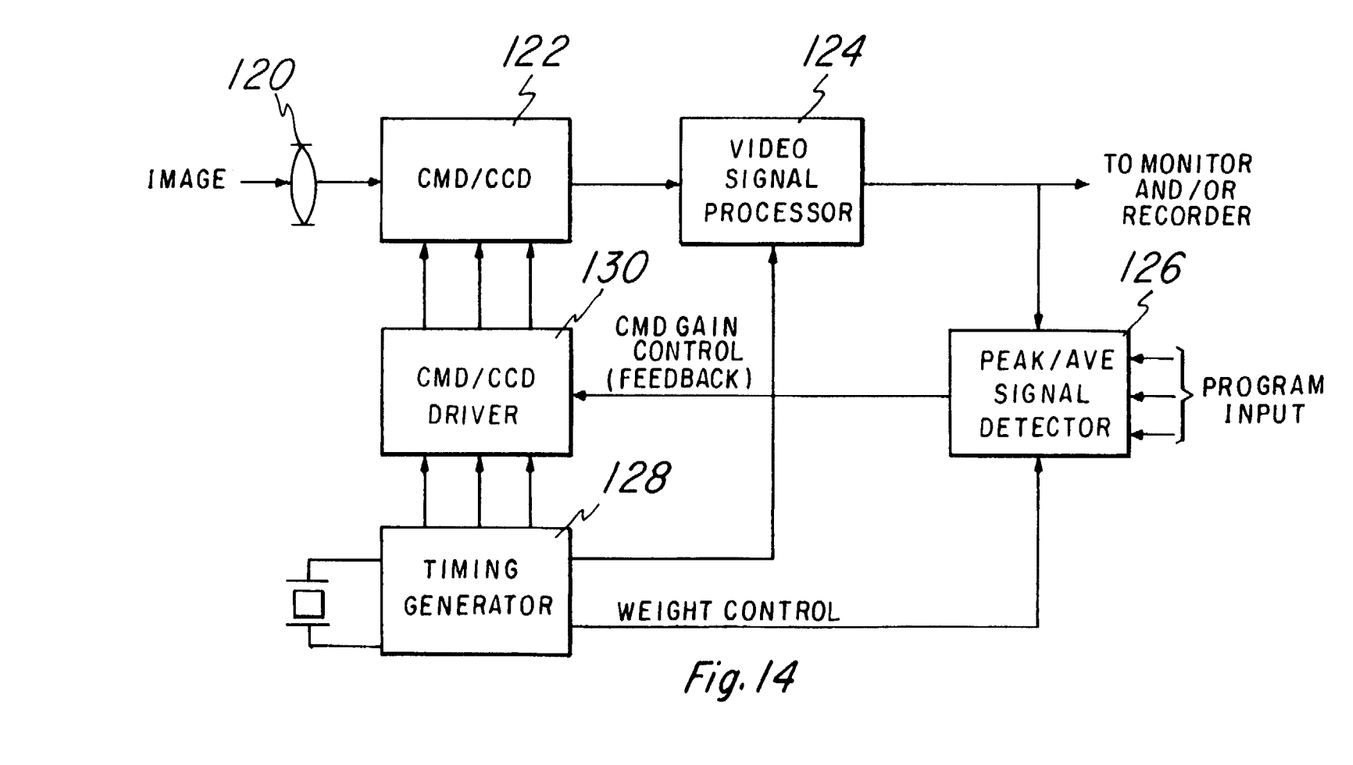
FIG. 14 is a schematic diagram of a CMD/CCD image system having automatic electronic iris control.

It will be readily appreciated by those skilled in the art that the variable gain nature of the CMD device lends itself particularly well for automatic gain control (AGC) systems incorporating feedback. This can allow the CCD in the image sensing system to have a gain factor that is dependent upon the conditions under which the system is operating. A block diagram of a typical system is illustrated in FIG. 14, where a lens 120 focuses an image onto a CMD/CCD image sensor array 122, which multiplies the charge level of the signal and provides a serial output to the video signal processor 124, whose output is fed to a monitor and/or video recorder. The output of the video signal processor is sampled by peak/average signal detector 126 based on external program input and a weight control from timing generator 128. Peak/average signal detector 126 provides a CMD gain control output to CMD/CCD driver circuitry 130 which is proportional to the scene illumination level seen by the system lens. This control signal is used by the CMD/CCD driver circuitry 130 to adjust the control signals sent to the CMD/CCD image sensor 122, thereby controlling the field strength and hence the gain of the device. In this way, the system can eliminate the need for an iris control on the lens 120, resulting in a lower cost lens and a more reliable electronic control of irising rather than mechanical, as well as providing a device with extended dynamic range.

A few preferred embodiments have been described in detail hereinabove. It is to be understood that the scope of the invention also comprehends embodiments different from those described, yet within the scope of the claims.

For example, special gate structures may be employed for the charge multiplication regions which maximize charge multiplication and device signal-to-noise ratio, special high-field implanted regions may be used under the CMD gate, built-in fixed field regions may be employed, etc.

Words of inclusion are to be interpreted as nonexhaustive in considering the scope of the invention.

Internal and external connections can be ohmic, capacitive, direct or indirect, via intervening circuits or otherwise. Implementation is contemplated in discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for automatic gain control in an image sensor array, comprising the steps of:
   sensing an image in said array;
   detecting a level of charge generated by said image in said array; and
   adjusting a bias level applied to said array in response to said detected level, said bias level generating a that said charge therein flows over a side of said well and then flows into said electric field region.

21. A charge multiplying device (CMD) charge coupled device (CCD) comprising:
a surface channel CCD cell;
a potential well in said CCD cell for temporarily holding charge;
an electric field region in a portion of said CCD cell separated from said potential well, said electric field created by creating a potential difference between two regions in said CCD cell by doping said regions differently;
a charge transfer barrier between said potential well and said electric field region to prevent said charge from flowing from said potential well region until said electric field region is of sufficient strength to cause impact ionization; and
means for causing said charge in said potential well to flow into said electric field region when said electric field region is of sufficient strength to cause impact ionization, said flow resulting in multiplication of said charge by impact ionization.

22. The device of claim 21 wherein said potential well is created by applying a potential to an area of said CCD cell.

23. The device of claim 21 wherein said means for causing is a gate adjacent said potential well having a potential applied thereto wherein the lowering of said potential decreases the size of said potential well such that said charge therein flows over a side of said well and then flows into said electric field region.

24. A charge multiplying device (CMD) charge coupled device (CCD) comprising:
a CCD cell based on a two dimensional electron gas structure;
a potential well in said CCD cell for temporarily holding charge;
an electric field region in a portion of said CCD cell separated from said potential well;
a charge transfer barrier between said potential well and said electric field region to prevent said charge from flowing from said potential well region until said electric field region is of sufficient strength to cause impact ionization; and
means for causing said charge in said potential well to flow into said electric field region when said electric field region is of sufficient strength to cause impact ionization, said flow resulting in multiplication of said charge by impact ionization.

25. The device of claim 24 wherein said potential well is created by applying a potential to an area of said CCD cell.

26. The device of claim 24 wherein said electric field is created by creating a potential difference between two areas of said CCD cell.

27. The device of claim 24 wherein said means for causing is a gate adjacent said potential well having a potential applied thereto wherein the lowering of said potential decreases the size of said potential well such that said charge therein flows over a side of said well and then flows into said electric field region.

* * * * *